United States Patent [19]

Moore et al.

[11] Patent Number: 5,294,557
[45] Date of Patent: Mar. 15, 1994

[54] IMPLANTING IMPURITIES IN SEMICONDUCTORS AND SEMICONDUCTOR IMPLANTED WITH IMPURITIES

[75] Inventors: Frederick G. Moore, Wala Wala, Wash.; Harry B. Dietrich, Fairfax, Va.

[73] Assignee: The United States of America as represented by the Secretary of the Navy, Washington, D.C.

[21] Appl. No.: 749,825

[22] Filed: Aug. 26, 1991

[51] Int. Cl.$^5$ ............................... H01L 21/265
[52] U.S. Cl. ................................ 437/22; 437/912; 437/934; 148/DIG. 56; 148/DIG. 83; 148/DIG. 84
[58] Field of Search ............ 437/22, 20, 912, 934; 148/DIG. 56, DIG. 83, DIG. 84

[56] References Cited

U.S. PATENT DOCUMENTS

| | | | |
|---|---|---|---|
| 4,033,788 | 7/1977 | Hunsperger et al. | 437/22 |
| 4,396,437 | 8/1983 | Kwok et al. | 148/1.5 |
| 4,472,206 | 9/1984 | Hodgson et al. | 437/22 |
| 4,558,509 | 12/1985 | Tiwari | 437/22 |
| 4,576,652 | 3/1986 | Hovel et al. | 437/22 |
| 4,615,766 | 10/1986 | Jackson et al. | 156/662 |
| 4,743,569 | 5/1988 | Plumton et al. | 437/22 |
| 4,820,651 | 4/1989 | Prince et al. | 437/22 |
| 4,879,259 | 11/1989 | Reynolds et al. | 437/22 |

FOREIGN PATENT DOCUMENTS

| | | | |
|---|---|---|---|
| 54-863 | 1/1979 | Japan | 437/22 |
| 58-145119 | 8/1983 | Japan | 437/22 |
| 62-2532 | 1/1987 | Japan. | |
| 62-2533 | 1/1987 | Japan. | |
| 1-93115 | 4/1989 | Japan. | |

OTHER PUBLICATIONS

Kamalov et al., "Electrical Activity of Silicon in Gallium Arsenide," Sov. Phys. Semicond. 12(3), Mar. 1978, pp. 340-341.

Masuyama et al., "Steady State Thermally Annealed GaAs with Room-Temperature-Implanted Si," Appl. Phys. Ltt. 36(9), May 1980, pp. 749-751.

Kuzuhara et al., "Infrared Rapid Thermal Annealing of Si-Implanted GaAs," Appl. Phys. Lett 41(8), Oct. 1982, pp. 755-758.

Moore et al., "Silicon Implantation into GaAs: Observations of Dose Rate Dependent Electrical Activation and Damage," Appl. Phys. Lett. 57(9) Aug. 1990, pp. 911-913.

*Primary Examiner*—Olik Chaudhuri
*Assistant Examiner*—Ourmazd S. Ojan
*Attorney, Agent, or Firm*—Thomas E. McDonnell; Barry A. Edelberg

[57] ABSTRACT

A method for ion-implanting a dopant species in semiconductors includes the steps of implanting a dopant species in a semiconductor material at a predetermined rate, the predetermined rate being based on a rate corresponding to a maximum in a characteristic graph of percent activation as a function of dopant species implantation rate; and annealing the dopant implanted semiconductor.

13 Claims, 6 Drawing Sheets

IMPLANTING IMPURITIES IN SEMICONDUCTORS AND SEMICONDUCTOR IMPLANTED WITH IMPURITIES

BACKGROUND OF THE INVENTION

1. Field of the Invention

This invention relates to the field of electrical activation of ion-implanted semiconductors. In particular, the invention relates to ion-implanted silicon in GaAs.

2. Description of the Related Art

The ion-implantation of semiconductors, and in particular the ion-implantation of silicon into GaAs, is an important doping technology for device fabrication. Particle accelerators accelerate silicon ions to impinge on and be implanted into GaAs. Implantation is followed by an annealing procedure which removes radiation induced damage and thermally transports dopants into lattice positions where they become electrically active. An activation of 100% is desirable, but in practice this is seldom achieved. For low fluences (from nil to $\approx 5 \times 10^{12}$ cm$^{-2}$) various annealing techniques can result in activations of more than 80%, but at higher fluences percent activation generally decrease. At higher fluences on the order of $10^{14}$ cm$^{-2}$, the reported activations vary widely and have been seen to depend strongly on the specifics of the post-implantation processing, including annealing.

The study of electrical activation of implanted dopants in GaAs as a function of implanted species, fluence and post-implant processing (annealing) has been an active research area in recent years. The ion-implantation process induces damage in the crystalline structure of the semiconductor. The annealing process reduces or ameliorates a portion of the induced damage. The study of implantation induced damage and its anneal characteristics has been ongoing for an even longer time than the study of electrical activation. Few of these studies report the dose rate with which the fluence was administered and there have been no studies reporting the impact of various dose rates on the electrical activation of the implanted species.

Japanese Patent No. 62-2533 to Ozawa discloses a method for obtaining sharp carrier concentration distributions by implanting silicon ions into an InGaAs layer at a specific accelerating voltage and at a specific dose after the ion-implantation is annealed. Ozawa discloses obtaining a peak carrier concentration of $7.5 \times 10^{18}$ cm$^{-3}$ when an accelerating voltage of 100 KeV is used with doses between $3 \times 10^{13}$ cm$^{-2}$ and $3 \times 10^{14}$ cm$^{-2}$ after the ion-implantation has been heat treated at 600° to 700° C. Ozawa does not disclose activation percentages or their dependency on implantation dose rates.

Japanese Patent No. 62-2532 to Ozawa disclosed a method for annealing an InGaAs ion-implanted dopant layer using a lamp furnace to enhance the activation of a conducting layer and to sharpen the carrier concentration distribution. Ozawa does not disclose the dependence of electrical activation on implantation dose rates.

U.S. Pat. No. 4,396,437 to Kwok et al. discloses a post-ion implantation annealing technique which involves applying an encapsulation over a device area capable of gettering a species that renders a substrate semi-insulating and then annealing the substrate to remove implantation damage resulting in high carrier mobility in an active region. The Kwok et al. patent does not disclose the dependence of electrical activation on implantation dose rates.

Japanese Patent No. 1-93115 to Tamura discloses a heat treating method to improve activation by applying an insulating film to one main surface of a semi-insulating GaAs substrate and then annealing the substrate before ion-implantation with SiF$_3$$^+$ improve the degree of activation. Tomura does not disclose the dependence of electrical activation on implantation dose rates.

U.S. Pat. No. 4,615,766 to Jackson et al. disclose a method of annealing ion-implanted doping impurities on at least one surface of a GaAs substrate by depositing a silicon capping layer after ion-implanting, and before annealing to remove damage to the substrate so as to prevent arsenic from evaporating from the substrate. Jackson et al. do not disclose the dependence of electrical activation on implantation dose rates.

SUMMARY OF THE INVENTION

It is an object of the present invention to provide a method by which electrical activation of dopants in semiconductor materials can be enhanced. In particular, the percentage activation of dopants when applied in high concentrations in semiconductors are enhanced by the methods described herein.

It is another object of the present invention to overcome deficiencies in the prior art by a method which enables high percentage activations of dopant to be achieved without requiring additional processing steps.

It is yet another object of the present invention to allow high percentage activation of dopants to be achieved in an inexpensive manner.

It is another object of the present invention to provide a method by Which electrical activation of dopants in semiconductor materials can be enhanced using standard processing techniques. In particular, the percentage activation of dopants when applied in high concentrations in semiconductors are enhanced by the methods described herein.

To achieve these and other objects, the inventors herein have discovered that the percentage of electrical activation of high concentrations of dopants in semiconductors is enhanced by controlling the dose rates of the ion-implantation of the dopants. In particular, silicon and sulphur ions implanted into GaAs at controlled implantation dose rates which accumulate to high dopant concentrations exhibit high electrical activation percentages when annealed. The method described herein comprises implanting a dopant species in a semiconductor material at a predetermined rate, said predetermined rate being based on a rate determined so that a maximum in a characteristic graph of percentage activation as a function of dopant species implantation rate is the predetermined rate. For instance, $10^{14}$ cm$^{-2}$ 100 KeV implanted Si ions activate most effectively with a doserate of 50 nanoamps per cm$^2$. The enhancement can be by as much as a factor of 3 over the activation obtained using lower and higher dose rates. It will be appreciated that different dopant species, implantation parameters (e.g. implantation energy) and different semiconductor materials will give rise to different characteristic graphs which relate percentage electrical activation to dopant species implantation rates. Nevertheless, for each combination of dopant species in semiconductor material type, an optimal dose rate will exist. The optimal dose rate can be determined from a characteristic experimentally determined graph of activation verses ion dose rate.

BRIEF DESCRIPTION OF THE DRAWINGS

The invention will be described in detail in the following description of the preferred embodiments with reference to the following figures wherein.

DESCRIPTION OF THE PREFERRED EMBODIMENTS

Figure 1:
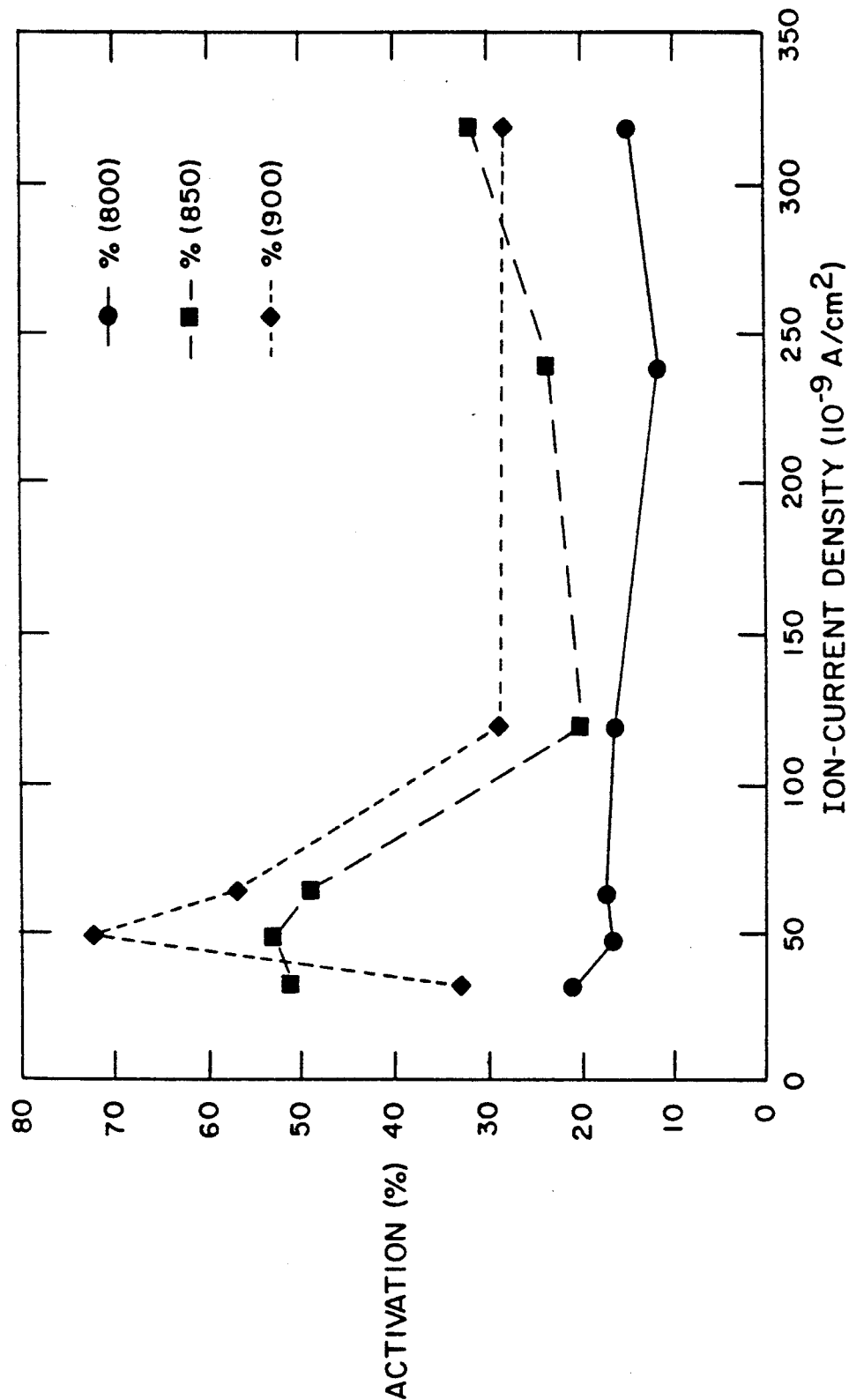
FIG. 1 is a graph of the electrical activation percentage of silicon implants as a function of ion dose rate for three furnace annealing conditions.

Described herein is a study of electrical activation of silicon implanted at a fluence of $10^{14}$ cm$^{-2}$. The study shows that electrical activation depends strongly on the dose rate of the implantation. This has been demonstrated for both furnace annealing and rapid thermal annealing procedures. Large differences in activation of the silicon are achieved for modest changes in the dose rate, especially at low dose rates. Based on experiments with Si implanted at a fluence of $10^{15}$ cm$^{-2}$, this effect can be correlated with a strong dependence of ion-induced damage on dose rate.

The ionic species selected in this study was $^{28}$Si$^+$, which was implanted after accelerating through an accelerating potential of 100 kV. The purity of the $^{28}$Si beam was confirmed by determining the isotopic ratios of 28:29:30 which were found to agree well with the natural occurrence of silicon isotopes. The implants were done at room temperature with the samples oriented nominally at 7° with respect to the incoming beam. The magnitude of the temperature rise during implantation was measured for the worst case situation (highest dose rate, i.e., 320 nA, for a $10$ cm$^{-2}$ fluence) and found to be less than 3° C.

Dose rate is a measure of the ion flux per unit time given as ions/(s-cm$^2$). However, since dosimetry is accomplished by current integration, a more convenient measure of dose rate is the ion current density. This latter quantity is obtained by measuring the scanned current and dividing by the defining aperture. The relationship between the dose rate (d$\phi$/dt) and the ion current density (J) is given by:

$$d\phi/dt = I/(Ae^-) = J/e^-,$$

where I is the scanned current, (A) is the defining aperture and e$^-$ is the electronic charge.

Commercially available, semi-insulating, LEC GaAs (liquid encapsulated Czochrolski GaAs) obtained from M/A COMM, a commercial vendor of GaAs, was used throughout the study. Samples were blown clean with dry nitrogen gas before introducing them into the implantation chamber. Sample mounting was facilitated by spring clips and no adhesives of any sort were used.

To investigate the activation behavior as a function of current density, a series of implants was done, varying the current density from 20 to 320 nA/cm$^2$, at a constant fluence of $10^{14}$ cm$^2$. At an energy of 100 keV, this fluence produces a peak atomic concentration of approximately $10^{19}$ cm$^{-3}$. The influence of annealing conditions on the implanted $^{28}$Si activation was investigated under furnace annealing and rapid thermal annealing conditions. It will be appreciated by persons skilled in the art having read the disclosure herein, that the advantages achieved by the present invention may be obtained by using other common annealing conditions. Samples that were furnace annealed were capped with 1000Å of Si$_3$N$_4$ deposited in a plasma enhanced chemical vapor deposition system. Rapid thermal annealing samples were not capped with nitride, but were placed with the implanted side down on GaAs proximity caps. Furnace anneals were isochronal and of a 15 minute duration. For the rapid thermal annealing process, a temperature/time profile of 980° C. for 12 seconds was used. The annealing atmosphere for both techniques was forming gas (10% H$_2$, 90% N$_2$).

The N-type carrier activation behavior for $10^{14}$ cm$^{-2}$ implants of silicon into GaAs under furnace annealing conditions is shown in FIG. 1 for three different 15 minute isochronal annealing temperatures. The activation, measured by the Hall effect, is plotted versus the dose rate. The samples annealed at 850° C. and 900° C. exhibit a large decrease in activation with increasing dose rate at current densities between 50 and 120 nA/cm$^2$. In addition, the dose rate behavior reaches a maximum at 50 nA/cm$^2$, with lower activations at currents below this value. The position of the maximum has been confirmed by subsequent work, with finer current density increments. The samples annealed at 800° C. show less variation over the range of current densities and the total activation is low. The data support previous reports that high annealing temperatures are required to remove implantation damage from high fluence implants of GaAs.

It is thus observed that the characteristic graph of electrical activation percentage as a function of implantation dose rate exhibits a peak at a specified dose rate. For example, FIG. 1 indicates a peak in electrical activation at a dose rate of 50 nA/cm$^2$, independent of subsequent annealing temperature. This peak is particularly pronounced when the ion implanted semiconductor is annealed at 900° C. and the resulting peak carrier concentration is over $7 \times 10^{18}$ cm$^{-3}$.

Figure 2:
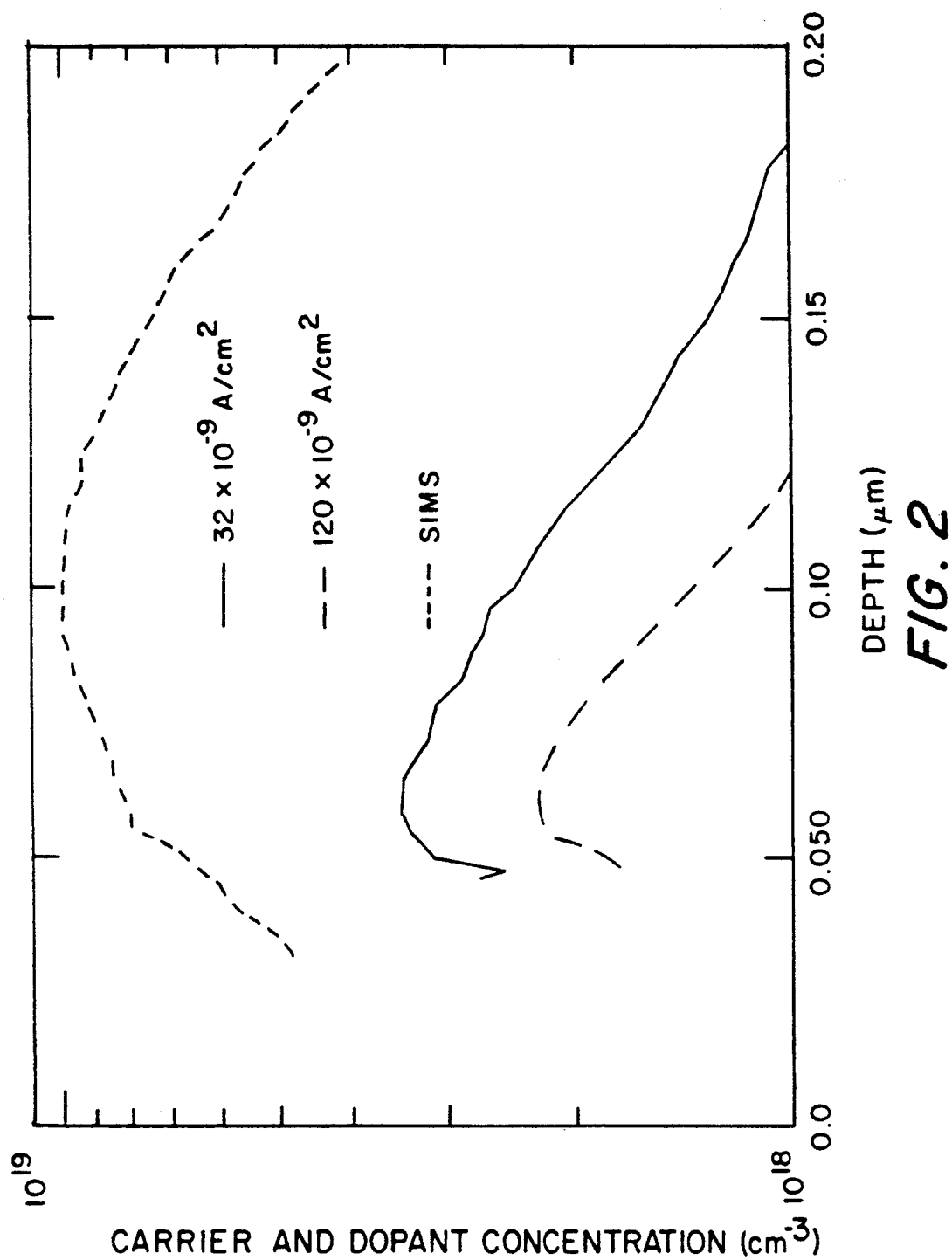
FIG. 2 is a graph of carrier and dopant concentration in a semiconductor as a function of depth of the carrier implanted at specified dose rates.

FIG. 2 illustrates the carrier concentration profiles for $10^{14}$ cm$^{-2}$ implants of silicon into GaAs at 100 keV for two different ion-current densities. The samples were annealed by rapid thermal annealing at 980° C. for twelve seconds. The carrier concentration was measured by the well known Polaron (TM) technique originally developed in the United Kingdom. Also illustrated in FIG. 2 is a SIMS (secondary ion mass spectroscopy) profile of the material which shows the silicon concentration, whether or not activated. The SIMS profile applies to either sample since both were produced from a fluence of $10^{14}$ cm$^{-2}$ implants. The integrated areas of the carrier profiles correspond to activations of 33% and 19%, respectively. The profiles indicate that the observed differences in activation occur over the entire profile range rather than being concentrated at a single depth.

Figure 3:
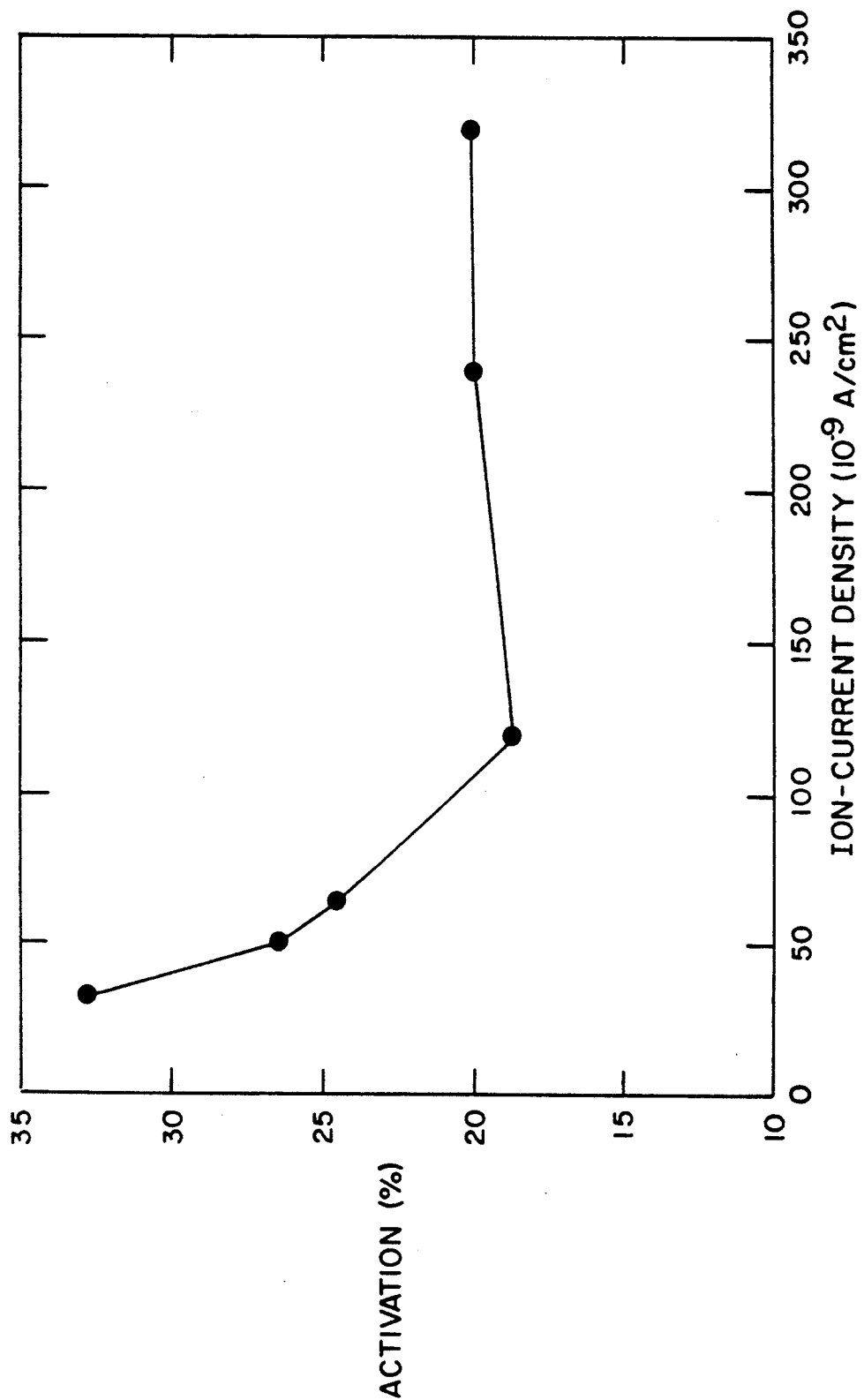
FIG. 3 is a graph of the electrical activation percentage as a function of ion dose rate in samples that were implanted with silicon and subjected to rapid thermal annealing post-processing.

FIG. 3 is a graph of the percentage activation as a function of ion-current density. The activation was determined by integration of the carrier concentration profiles. Silicon ions were implanted at an acceleration voltage of 100 keV and a total fluence of $10^{14}$ cm$^{-2}$. The samples were annealed by rapid thermal annealing at a temperature of 980° C. for twelve seconds. These samples which were annealed by rapid thermal annealing showed the same type of dose rate dependence as were shown by the furnace annealed samples. Thus, it is apparent that the effect of varying the dose rate on carrier concentration is not sensitive to the annealing conditions, although the material that was activated by rapid thermal annealing shows a lower total activation than the material that was furnace annealed. The peak in the activation characteristic graph shows the same dose rate dependence.

A given average implantation current density can be obtained in two ways. In the first way, the scan of the ion beam can be held constant and the instantaneous beam current changed. In the other way the ion beam current can be held constant and the magnitude of the overscan changed. These two ways of controlling current density provide a way to assess the relative importance of the instantaneous current and the average current density. Samples were implanted with the same average current density but with instantaneous beam currents which varied by a factor of 4. These samples showed no appreciable difference in electrical activation. Thus, it is apparent that variations in electrical activation are correlated with the average current density to a greater extent than the activation may be correlated with the instantaneous current density, if at all.

Figure 4:
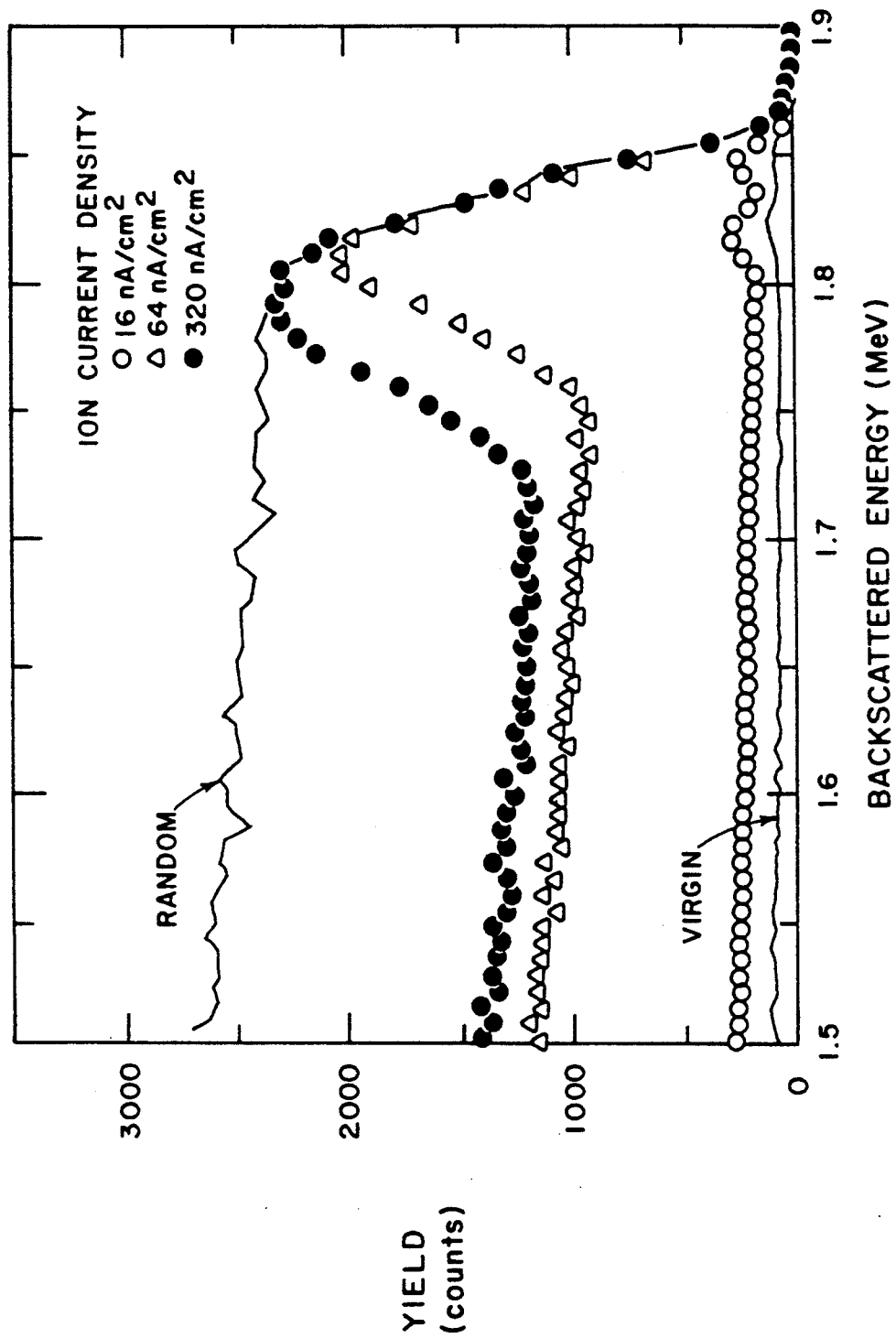
FIG. 4 is a graph of the number of the nuclei backscattered from the crystal damage which results from ion-implantation of silicon as a function of backscattered energy for selected implantation dose rates and controls.

The dose rate affects not only the subsequent electrical activation, but also affects the amount of damage induced in the crystalline structure. This damage effect is particularly evident in Rutherford backscattering spectra channeling measurements of GaAs implanted with a $10^{15}$ cm$^{-2}$ fluence of silicon. Samples were prepared representing three different ion-current densities: 16, 64, and 320 nA/cm$^2$. Rutherford backscattering is a well known technique to measure residual crystal damage wherein He nuclei are accelerated and impinge on the crystal aligned along a specific axis. The He nuclei largely channel through an undamaged and aligned crystal. Crystal damage will cause nuclei to be backscattered. These nuclei are then detected and counted. The energy of the backscattered nucleus decreases when the distance beneath the surface of the particle from which it has scatter increases. Counts for channeling spectra oriented along the <110> were collected. FIG. 4 is a graph showing the relationship between these counts and the backscattered energy for three samples prepared at the three different ion-current densities and an aligned spectrum from a virgin crystal and a randomly oriented yield spectrum The backscattered yield for energy levels between 1.75 and 1.85 MeV is seen to increase dramatically as the dose rate increases. This region encompasses the implanted range of the silicon ions.

At the highest current density (320 nA/cm$^2$), the backscattered yield is essentially equivalent to the backscatter yield of the randomly oriented material, indicating that the implantation produced a continuous amorphous layer over this range. However, at the lowest current density (16 nA/cm$^2$) the yield is substantially lower and only slightly above the yield of a virgin crystalline material. Thus, it is apparent that the implantation induce damage in ion-irradiated GaAs is strongly dependent on the implantation rate.

Figure 5:
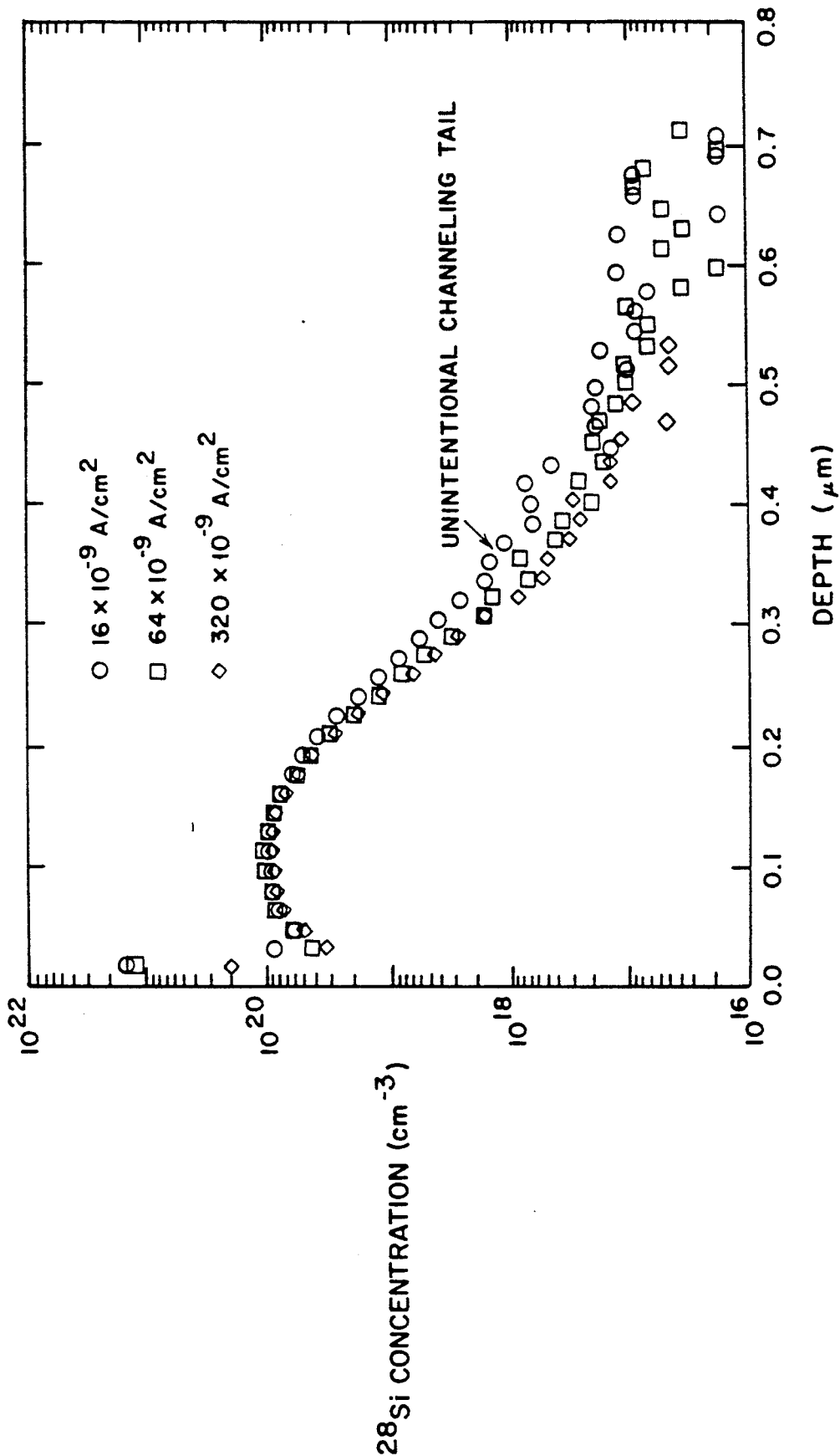
FIG. 5 is a graph of dopant concentrations as a function of depth for the same semiconductor samples shown in FIG. 4.

FIG. 5 illustrates the silicon concentration profiles as a function of depth within the samples that were used for generation of the graph in FIG. 4. These profiles indicate that each of the three samples collected the same total silicon dose. Thus, it is apparent that the variation in backscattered spectra yield illustrated in FIG. 4 is a function of dose rate and not due to variations in the total silicon dose. FIG. 5 indicates that the lowest dose rate implant has a slight channeling tail which is consistent with the Rutherford backscattering spectra results showing the crystallinity of the sample.

Figure 6:
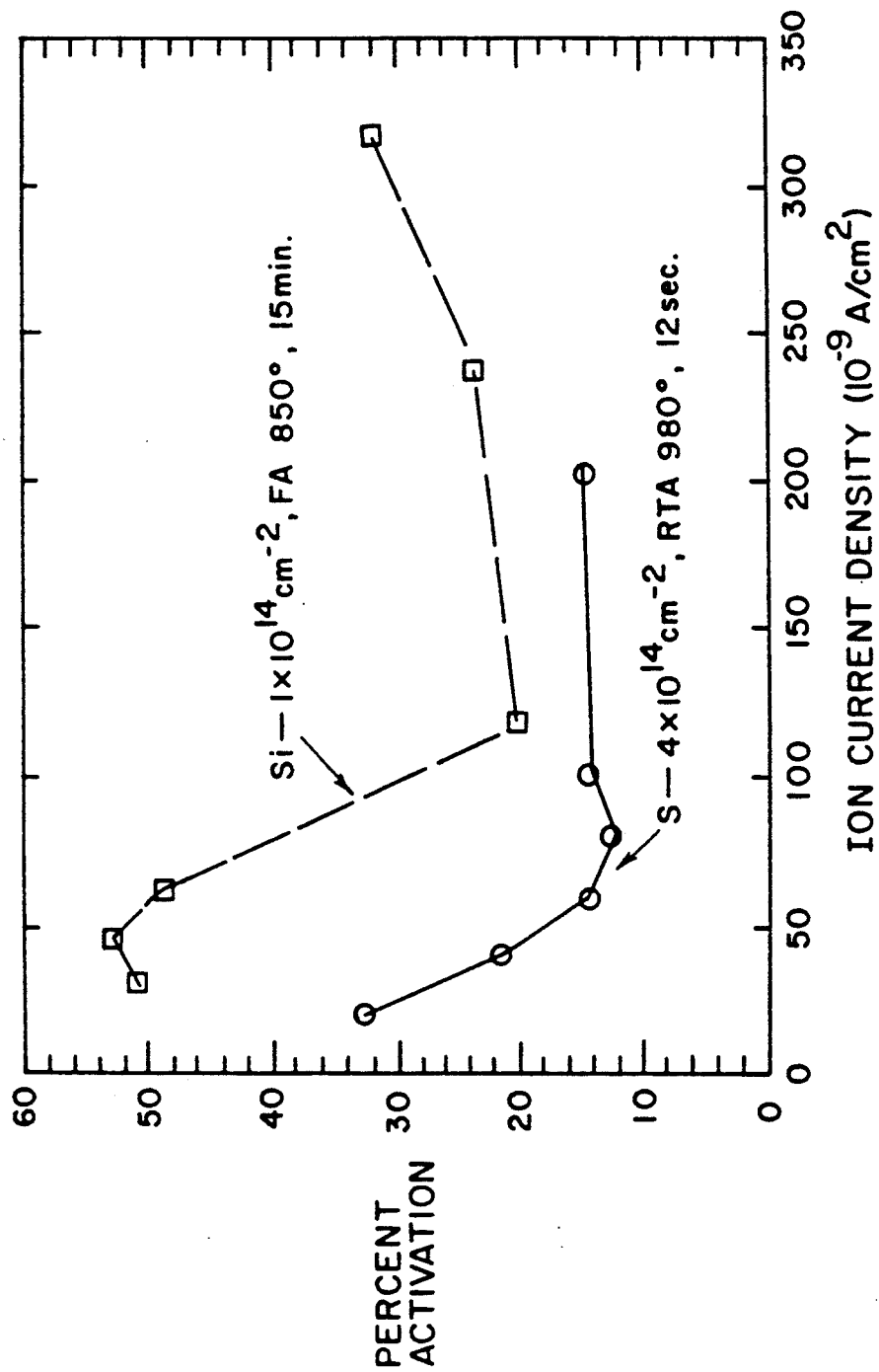
FIG. 6 is a comparison graph of electrical activation percentage as a function of ion dose rate between two sets of samples that were implanted with silicon and sulphur respectively.

FIG. 6 is analogous to FIG. 3 but illustrates the characteristic curve of dose-rate dependent activation of sulphur implants in GaAs. The activation was determined by Hall measurement of samples that were implanted with sulphur at an energy of 100 keV and a total fluence of $4 \times 10^{14}$ cm$^{-2}$. The samples were annealed by rapid thermal annealing at a temperature of 980° C. for twelve seconds. These samples show the same type of dose rate dependence as were shown by the furnace annealed and rapid thermal annealed samples which received silicon implants.

In FIG. 6, the percent activation of silicon implants decreases at implantation rates lower than the implantation rate of the peak in the characteristic graph. The percent activation of sulphur implants increases when using lower implantation rates. For sulphur, the designer may choose to achieve a higher percent activation by using slower implantation rates. However, there are diminishing benefits to the increased percent activation because of increasing costs in the form of increased implantation time. Therefore, the designer will be able to choose an implantation rate to achieve maximum commercial or economical benefit given the implantation equipment available.

Thus, it will be appreciated that the dose rate has a pronounced effect on the subsequent electrical activation of silicon and sulphur implanted into GaAs. For a silicon fluence of $10^{14}$ cm$^{-2}$ and a sulphur fluence of $4 \times 10^{14}$ cm$^{-2}$, both at an implantation energy of 100 keV, maximum activation of the dopant is achieved at current densities of less than 100 nA/cm$^2$. This effect is observed in samples that are both furnace annealed and in samples that are rapid thermal annealed. For standard furnace annealing, the effect is most pronounced at the higher annealing temperatures of 850° C. and 900° C. It will be further appreciated that there is a pronounced dose rate dependence of damage within the crystalline structure.

It is apparent that at the fluences and dose rates investigated the enhanced electrical activation of the implanted dopants cannot be a result of the damage accumulation mechanisms ascribed to by the prior art. The prior art's conventional wisdom would propose that no enhanced activation could be realized by utilizing low dose rate implantation. In particular, the prior art would advance the notion that the exact nature of the implantation damage generated by a low dose rate (the present invention) is identical with the nature of the implantation damage generated by a high dose rate (the prior art) and that the eventual percentage of electrical activation of the implant is independent of the implantation dose rate. This is clearly not the case as the present invention documents an inherent flaw in the prior art and demonstrates a method to achieve superior electrical activation through low dose rate implantation.

Since the advantages of enhanced electrical activation resulting from low implantation rates are unknown to the prior art, designers presently choose implantation rates 10 to 100 times higher than the implantation rates disclosed herein in order to maximize the economic utilization of implantation equipment. This results in a lower percent activation than could be achieved with the invention herein. To compensate for this low percent activation, designers specify various pre- and post-implantation processes which increase the cost of the doped semiconductor. The invention herein enhances percent activation for high fluences, without the need for complicated pre- and post-implantation processes. Thus, for example, the designer may now choose a low implantation rate to be used with standard annealing processes.

These dose rate effects have been shown to be significant for GaAs applications, particularly those that require an n+ active region, and it is expected that they will exist for all III-V semiconductors. With appropriate dose rate implantation it may be possible to attain carrier concentrations on the order to $10^{19}$ cm$^{-3}$ using silicon implantation. Indeed, the 74% activation indicated in the Hall data from FIG. 1, corresponds to a peak n-type carrier concentration of over $7 \times 10^{18}$ cm$^{-3}$, which is very close to the highest n-type carrier concentrations achieved with silicon doping via ion-implantation into GaAs. Typical prior art processes can obtain a maximum n-type carrier concentration of $2 \times 10^{18}$ cm$^{-3}$. Doped materials having n-type carrier concentrations of more than about $2 \times 10^{18}$ cm$^{-3}$, such as about 2.5 or $3 \times 10^{18}$ to about $10^{19}$ cm$^{-3}$, more preferably about $5 \times 10^{18}$ to about $10^{18}$ cm$^{-3}$, which are made possible according to the present invention, offer exciting possibilities.

Thus, it will be appreciated by persons skilled in this art that a characteristic graph relating electrical activation to ion-implantation dose rate may be produced for any combination of dopant species, implantation parameters and semiconductor under a wide range of annealing and other processing conditions, and that when a maximum appears, as is expected to be the case, at least for at semiconductors in the III-V systems, a preferred ion-implantation dose rate for the specified dopant species exists. It will be further appreciated that the disclosure herein teaches a method for producing a doped semiconductor material having enhanced carrier activation comprising the steps of implanting a dopant species in the semiconductor material at a predetermined rate, said predetermined rate being based on the dose rate at a maximum in a characteristic graph of percent activation as a function of dopant species implantation rate, and annealing said dopant implanted semiconductor material. It will be further appreciated that a doped semiconductor may be produced according to the described method to have a maximum carrier activation when a dopant species is implanted at the dopant species implantation rate corresponding to a maximum in a characteristic graph of percent activation as a function of dopant species implantation rate.

Typical substrates which may be doped according to the present invention include III-V semiconductors, which includes combinations such as Ga, In, Al/As, Sb, P. While any dopant, such as Si, Ge, Se or S may be implanted according to the present invention. The method is particularly applicable to the doping of III-V systems with group IV elements and sulfur. Because the effect upon which the present invention is based is related to the damage induced by implantation, it is expected that the dose rate at which maximum activation is achieved will shift to the left (decrease) with heavier dopants. For each semiconductor, the dose rate effects should be the same for similar mass ions, for example Si and S.

The fluence at which the dopant is preferably at or near the maximum fluence where damage induced by implantation can be removed by annealing, preferably by conventional, simple annealing processes such as furnace annealing or rapid thermal annealing. As the fluence decreases or increases outside the maximum fluence, the effect of the present invention decreases. Typically, at least for the III-V substrates, the fluence while be on the order of about $10^{13}$ to about $10^{14}$ cm$^{-2}$.

Having described the preferred embodiments of a novel method for implanting impurities in semiconductors (which are intended to be illustrative and not limiting), it is noted that modifications and variations can be made by those skilled in the art in light of the above teachings. It is therefore to be understood that changes may be made in the particular embodiments of the invention disclosed which are within the scope and spirit of the invention as defined by the appended claims.

Having thus described the invention with the details and particularity required by the patent laws, what is claimed and desired protected by letters patent is set forth in the following claims.

What is claimed is:

1. A method of doping substrate to produce a doped semiconductor material having enhanced carrier activation, comprising the steps of:
    selecting a dopant species for ion-implantation into said substrate;
    determining a maximum implantation dose rate of said dopant species, at which percent activation of said dopant species after an annealing step, as a function of ion-implantation dose rate, is at a maximum;
    implanting a dopant species into said substrate at about said maximum dose rate and at a fluence of at least $10^{13}$ cm$^2$; and
    annealing said dopant implanted semiconductor material.

2. The method of claim 1, wherein said dopant species is silicon.

3. The method of claim 1, wherein said dopant species is sulphur.

4. The method of claim 1, wherein said substrate is a III-V compound.

5. The method of claim 4, wherein said substrate is GaAs.

6. The method of claim 4, wherein said dopant species is silicon.

7. The method of claim 4, wherein said dopant species is sulphur.

8. The method of claim 1, wherein said annealing step comprises furnace annealing.

9. The method of claim 1, wherein said annealing step comprising rapid thermal annealing.

10. The method of claim 1, wherein said implanting is done at a fluence of at least about $10^{14}$ cm$^2$.

11. The method of claim 1, wherein said dopant is an n-type dopant and said implanting step comprises implanting said n-type dopant in an amount effective to attain an n-type carrier concentration in said substrate of at least $3 \times 10^{18}$ cm$^{-3}$ after said annealing step.

12. The method of claim 11, wherein said implanting step comprises implanting said n-type dopant in an amount effective to attain an n-type carrier concentration in said substrate of at least $3 \times 10^{18}$ cm$^{-3}$ to about $10^{19}$ cm$^{-3}$ after said annealing step.

13. The method of claim 11, wherein said implanting step comprises implanting said n-type dopant in an amount effective to attain an n-type carrier concentration in said substrate of about $5 \times 10^{18}$ cm$^{-3}$ to about $10^{19}$ cm$^{-3}$ after said annealing step.

* * * * *